United States Patent
Lines

(10) Patent No.: US 8,023,314 B2
(45) Date of Patent: *Sep. 20, 2011

(54) DYNAMIC MEMORY WORD LINE DRIVER SCHEME

(75) Inventor: Valerie L. Lines, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 206 days.

This patent is subject to a terminal disclaimer.

(21) Appl. No.: 12/405,153

(22) Filed: Mar. 16, 2009

(65) Prior Publication Data

US 2009/0237981 A1    Sep. 24, 2009

Related U.S. Application Data

(63) Continuation of application No. 11/396,306, filed on Mar. 30, 2006, now Pat. No. 7,535,749, which is a continuation of application No. 10/791,437, filed on Mar. 2, 2004, now Pat. No. 7,038,937, which is a continuation of application No. 10/463,194, filed on Jun. 17, 2003, now abandoned, which is a continuation of application No. 09/919,752, filed on Jul. 31, 2001, (Continued)

(51) Int. Cl.
    *G11C 11/24*    (2006.01)

(52) U.S. Cl. .................. 365/149; 365/150; 365/189.11; 365/230.06

(58) Field of Classification Search .................. 365/149, 365/150, 189.18, 230.06
See application file for complete search history.

(56) References Cited

U.S. PATENT DOCUMENTS 3,387,286 A    6/1968   Dennard
(Continued)

FOREIGN PATENT DOCUMENTS

EP      0010137 A1    4/1980
(Continued)

OTHER PUBLICATIONS

"An Analysis of Toshiba TC511000/TC511001 CMOS 1Mx1 DRAMs," (Author Unknown), MOSAID Inc., pp. 29-36, 145-159, Aug. 1986.

(Continued)

*Primary Examiner* — Pho M Luu

(74) *Attorney, Agent, or Firm* — Hamilton, Brook, Smith & Reynolds, P.C.

(57) ABSTRACT

A circuit which accurately controls the word line (pass transistor gate) driving voltage to a voltage which is both controlled and is not significantly greater than is needed to drive the word line. The circuit eliminates the need for a double-boot-strapping circuit, and ensures that no voltages exceed that necessary to fully turn on a memory cell access transistor. Voltages in excess of that which would reduce reliability are avoided, and accurate driving voltages are obtained. A DRAM includes word lines, memory cells having enable inputs connected to the word lines, a gate receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines whereby an above $V_{dd}$ voltage level word line is achieved without the use of double boot-strap circuits.

21 Claims, 1 Drawing Sheet

Related U.S. Application Data

Figure 1:
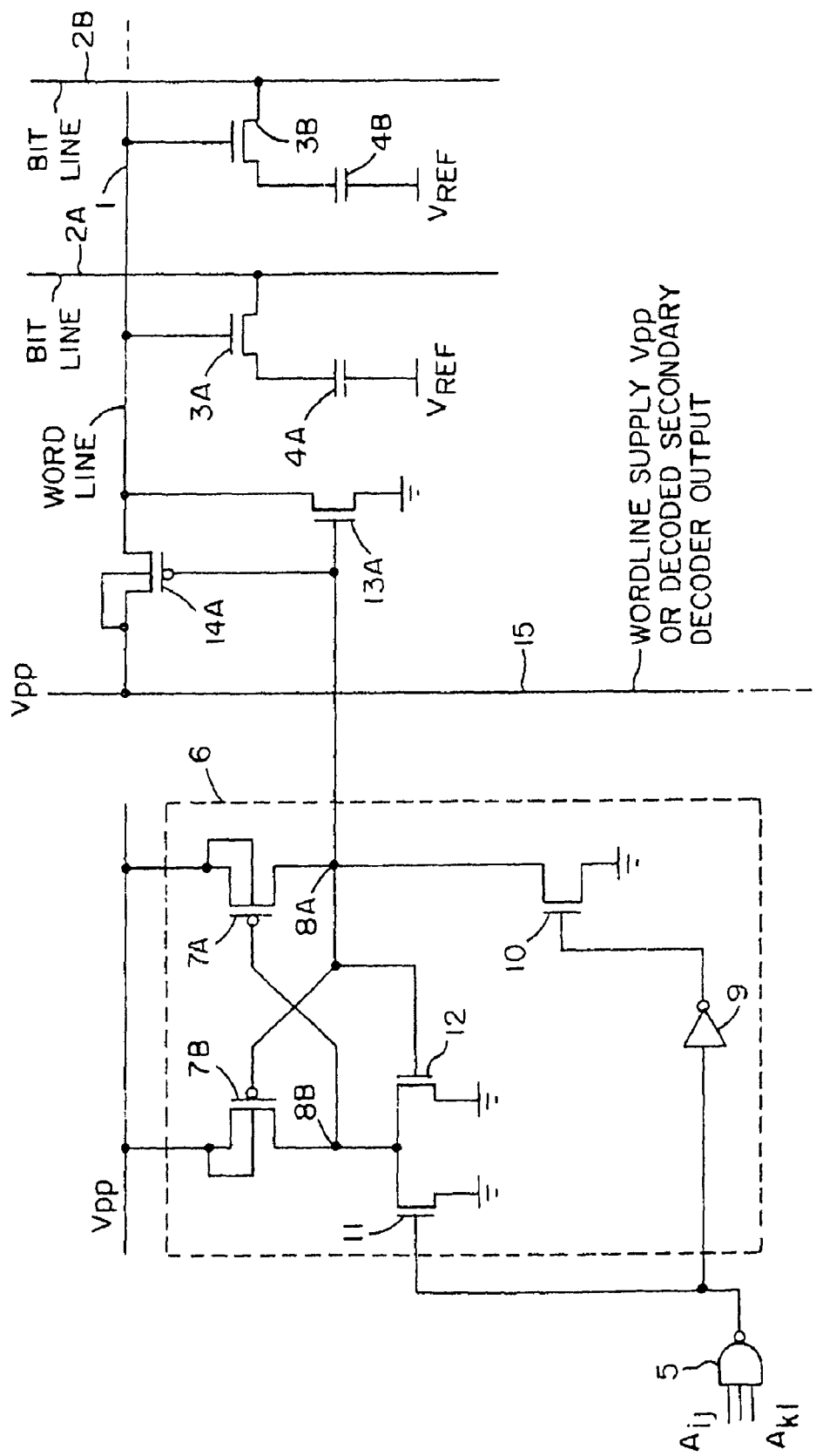

(63) now Pat. No. 6,603,703, which is a continuation of application No. 09/548,879, filed on Apr. 13, 2000, now Pat. No. 6,278,640, which is a continuation of application No. 09/123,112, filed on Jul. 27, 1998, now Pat. No. 6,061,277, which is a continuation of application No. 08/705,534, filed on Aug. 29, 1996, now abandoned, which is a continuation of application No. 08/611,558, filed on Mar. 6, 1996, now Pat. No. 5,751,643, which is a continuation-in-part of application No. 08/515,904, filed on Aug. 16, 1995, now Pat. No. 5,822,253, which is a continuation of application No. 08/205,776, filed on Mar. 3, 1994, now abandoned, which is a continuation of application No. 08/031,898, filed on Mar. 16, 1993, now abandoned, which is a continuation of application No. 07/680,746, filed on Apr. 5, 1991, now Pat. No. 5,214,602.

(56) References Cited

U.S. PATENT DOCUMENTS

| | | | |
|---|---|---|---|
| 3,761,899 | A | 9/1973 | McKenny et al. |
| 3,790,812 | A | 2/1974 | Fry |
| 3,801,831 | A | 4/1974 | Dame |
| 3,942,047 | A | 3/1976 | Buchanan |
| 3,980,899 | A | 9/1976 | Shimada et al. |
| 4,000,412 | A | 12/1976 | Rosenthal et al. |
| 4,001,606 | A | 1/1977 | Dingwall |
| 4,029,973 | A | 6/1977 | Kobayashi et al. |
| 4,037,114 | A | 7/1977 | Stewart et al. |
| 4,039,862 | A | 8/1977 | Dingwall et al. |
| 4,045,691 | A | 8/1977 | Asano |
| 4,047,091 | A | 9/1977 | Hutchines et al. |
| 4,061,929 | A | 12/1977 | Asano |
| 4,080,539 | A | 3/1978 | Stewart |
| 4,106,086 | A | 8/1978 | Holbrook et al. |
| 4,189,782 | A | 2/1980 | Dingwall |
| 4,199,806 | A | 4/1980 | Patterson, III |
| 4,208,595 | A | 6/1980 | Gladstein |
| 4,216,390 | A | 8/1980 | Stewart |
| 4,271,461 | A | 6/1981 | Hoffmann et al. |
| 4,279,010 | A | 7/1981 | Morihisa |
| 4,307,333 | A | 12/1981 | Hargrove |
| 4,330,852 | A | 5/1982 | Redwine et al. |
| 4,338,569 | A | 7/1982 | Petrich |
| 4,344,003 | A | 8/1982 | Harmon et al. |
| 4,344,005 | A | 8/1982 | Stewart |
| 4,403,158 | A | 9/1983 | Slemmer |
| 4,433,253 | A | 2/1984 | Zapisek |
| 4,442,481 | A | 4/1984 | Brahmbhatt |
| 4,471,290 | A | 9/1984 | Yamaguchi |
| 4,486,670 | A | 12/1984 | Chan et al. |
| 4,506,164 | A | 3/1985 | Higuchi |
| 4,511,811 | A | 4/1985 | Gupta |
| 4,527,258 | A | 7/1985 | Guterman |
| 4,533,843 | A | 8/1985 | McAlexander, III et al. |
| 4,543,500 | A | 9/1985 | McAlexander et al. |
| 4,581,546 | A | 4/1986 | Allan |
| 4,583,157 | A | 4/1986 | Kirsch et al. |
| 4,604,582 | A | 8/1986 | Strenkowski et al. |
| 4,612,462 | A | 9/1986 | Asano et al. |
| 4,616,303 | A | 10/1986 | Mauthe |
| 4,621,315 | A | 11/1986 | Vaughn et al. |
| 4,623,805 | A | 11/1986 | Flora et al. |
| 4,628,214 | A | 12/1986 | Leuschner |
| 4,636,930 | A | 1/1987 | Bingham et al. |
| 4,637,018 | A | 1/1987 | Flora et al. |
| 4,638,182 | A | 1/1987 | McAdams |
| 4,639,622 | A | 1/1987 | Goodwin et al. |
| 4,642,798 | A | 2/1987 | Rao |
| 4,656,373 | A | 4/1987 | Plus |
| 4,670,861 | A | 6/1987 | Shu et al. |
| 4,673,829 | A | 6/1987 | Gupta |
| 4,678,941 | A | 7/1987 | Chao et al. |
| 4,679,134 | A | 7/1987 | Bingham et al. |
| 4,689,504 | A | 8/1987 | Raghunathan et al. |
| 4,692,638 | A | 9/1987 | Stiegler |
| 4,697,252 | A | 9/1987 | Furuyama et al. |
| 4,716,313 | A | 12/1987 | Hori et al. |
| 4,730,132 | A | 3/1988 | Watanabe et al. |
| 4,733,108 | A | 3/1988 | Truong |
| 4,740,918 | A | 4/1988 | Okajima et al. |
| 4,751,679 | A | 6/1988 | Dehganpour |
| 4,782,247 | A | 11/1988 | Yoshida |
| 4,795,985 | A | 1/1989 | Gailbreath, Jr. |
| 4,798,977 | A | 1/1989 | Sakui et al. |
| 4,807,104 | A | 2/1989 | Floyd et al. |
| 4,807,190 | A | 2/1989 | Ishii et al. |
| 4,811,304 | A | 3/1989 | Matsuda et al. |
| 4,814,647 | A | 3/1989 | Tran |
| 4,820,941 | A | 4/1989 | Dolby et al. |
| 4,823,318 | A | 4/1989 | D'Arrigo et al. |
| 4,837,462 | A | 6/1989 | Watanabe et al. |
| 4,843,256 | A | 6/1989 | Scade et al. |
| 4,845,437 | A | 7/1989 | Mansur et al. |
| 4,857,763 | A | 8/1989 | Sakurai et al. |
| 4,873,673 | A | 10/1989 | Hori et al. |
| 4,878,201 | A | 10/1989 | Nakaizumi |
| 4,881,201 | A | 11/1989 | Sato et al. |
| 4,888,738 | A | 12/1989 | Wong et al. |
| 4,906,056 | A | 3/1990 | Taniguchi |
| 4,926,070 | A | 5/1990 | Tanaka et al. |
| 4,951,259 | A | 8/1990 | Sato et al. |
| 4,958,091 | A | 9/1990 | Roberts |
| 4,961,007 | A | 10/1990 | Kumanoya et al. |
| 4,982,317 | A | 1/1991 | Mauthe |
| 4,984,202 | A | 1/1991 | Kawahara et al. |
| 5,010,259 | A | 4/1991 | Inoue et al. |
| 5,018,107 | A | 5/1991 | Yoshida |
| 5,023,465 | A | 6/1991 | Douglas et al. |
| 5,031,149 | A | 7/1991 | Matsumoto et al. |
| 5,038,325 | A | 8/1991 | Douglas et al. |
| 5,038,327 | A | 8/1991 | Akaogi |
| 5,051,959 | A | 9/1991 | Nakano et al. |
| 5,053,668 | A | 10/1991 | Mitsuyasu |
| 5,059,815 | A | 10/1991 | Bill et al. |
| 5,086,238 | A | 2/1992 | Watanabe et al. |
| 5,101,117 | A | 3/1992 | Johnson et al. |
| 5,101,381 | A | 3/1992 | Kouzi |
| 5,103,113 | A | 4/1992 | Inui et al. |
| 5,109,394 | A | 4/1992 | Hjerpe et al. |
| 5,111,063 | A | 5/1992 | Iwata |
| 5,134,616 | A | 7/1992 | Barth, Jr. et al. |
| 5,150,325 | A | 9/1992 | Yanagisawa et al. |
| 5,151,616 | A | 9/1992 | Komuro |
| 5,159,215 | A | 10/1992 | Murotani |
| 5,196,996 | A | 3/1993 | Oh |
| 5,197,033 | A | 3/1993 | Watanabe et al. |
| 5,208,776 | A | 5/1993 | Nasu et al. |
| 5,245,576 | A | 9/1993 | Foss et al. |
| 5,252,867 | A | 10/1993 | Sorrells et al. |
| 5,262,999 | A | 11/1993 | Etoh et al. |
| 5,264,743 | A | 11/1993 | Nakagome et al. |
| 5,267,201 | A | 11/1993 | Foss et al. |
| 5,272,390 | A | 12/1993 | Watson, Jr. et al. |
| 5,272,729 | A | 12/1993 | Bechade et al. |
| 5,276,646 | A | 1/1994 | Kim et al. |
| 5,295,164 | A | 3/1994 | Yamamura |
| 5,297,097 | A | 3/1994 | Etoh et al. |
| 5,307,315 | A | 4/1994 | Oowaki et al. |
| 5,311,476 | A | 5/1994 | Kajimoto et al. |
| 5,311,483 | A | 5/1994 | Takasugi |
| 5,317,202 | A | 5/1994 | Waizman |
| 5,319,755 | A | 6/1994 | Farmwald et al. |
| 5,323,354 | A | 6/1994 | Matsumoto et al. |
| 5,337,284 | A | 8/1994 | Cordoba et al. |
| 5,337,285 | A | 8/1994 | Ware et al. |
| 5,347,488 | A | 9/1994 | Matsubita |
| 5,351,217 | A | 9/1994 | Jeon |
| 5,371,764 | A | 12/1994 | Gillingham et al. |
| 5,377,156 | A | 12/1994 | Watanabe et al. |
| 5,384,735 | A | 1/1995 | Park et al. |
| 5,406,523 | A | 4/1995 | Foss et al. |

| | | | |
|---|---|---|---|
| 5,412,615 A | 5/1995 | Noro et al. | |
| 5,414,381 A | 5/1995 | Nelson et al. | |
| 5,432,823 A | 7/1995 | Gasbarro et al. | |
| 5,440,514 A | 8/1995 | Flannagan et al. | |
| 5,463,337 A | 10/1995 | Leonowich | |
| 5,602,771 A | 2/1997 | Kajigaya et al. | |
| 5,602,796 A * | 2/1997 | Sugio | 365/230.06 |
| 5,657,481 A | 8/1997 | Farmwald et al. | |
| 5,699,313 A | 12/1997 | Foss et al. | |
| 5,751,643 A | 5/1998 | Lines | |
| 5,796,673 A | 8/1998 | Foss et al. | |
| 5,812,832 A | 9/1998 | Horne et al. | |
| 5,822,253 A | 10/1998 | Lines | |
| 5,828,620 A | 10/1998 | Foss et al. | |
| 5,912,564 A | 6/1999 | Kai et al. | |
| 5,973,974 A | 10/1999 | Shirley | |
| 6,055,201 A | 4/2000 | Foss et al. | |
| 6,061,277 A | 5/2000 | Lines | |
| 6,067,272 A | 5/2000 | Foss et al. | |
| 6,205,083 B1 | 3/2001 | Foss et al. | |
| 6,236,581 B1 | 5/2001 | Foss et al. | |
| 6,256,248 B1 | 7/2001 | Leung | |
| 6,278,640 B1 | 8/2001 | Lines | |
| 6,282,606 B1 | 8/2001 | Holland | |
| 6,314,052 B2 | 11/2001 | Foss et al. | |
| 6,392,958 B1 | 5/2002 | Lee | |
| 6,446,021 B1 | 9/2002 | Schaeffer | |
| 6,449,685 B1 | 9/2002 | Leung | |
| 6,496,437 B2 | 12/2002 | Leung | |
| 6,580,654 B2 | 6/2003 | Foss et al. | |
| 6,590,800 B2 * | 7/2003 | Chang | 365/154 |
| 6,603,703 B2 | 8/2003 | Lines | |
| 6,614,705 B2 | 9/2003 | Foss et al. | |
| 6,657,918 B2 | 12/2003 | Foss et al. | |
| 6,657,919 B2 | 12/2003 | Foss et al. | |
| 6,847,573 B2 | 1/2005 | Lee et al. | |
| 6,898,130 B2 | 5/2005 | Kajigaya et al. | |
| 6,980,448 B2 | 12/2005 | Foss et al. | |
| 6,992,950 B2 | 1/2006 | Foss et al. | |
| 7,038,937 B2 | 5/2006 | Lines | |
| 7,312,636 B2 * | 12/2007 | Lines | 326/81 |
| 7,541,837 B2 * | 6/2009 | Lines | 326/68 |

FOREIGN PATENT DOCUMENTS

| | | |
|---|---|---|
| EP | 0197505 A2 | 10/1986 |
| EP | 0942430 A1 | 9/1999 |
| GB | 2184902 A | 7/1987 |
| GB | 2204456 A | 11/1988 |
| GB | 2 243 233 A | 10/1991 |
| JP | 53-90835 | 8/1978 |
| JP | 56-62066 | 5/1981 |
| JP | 59-213090 | 12/1984 |
| JP | 61030846 | 2/1986 |
| JP | 62-21323 | 1/1987 |
| JP | 62020200 | 1/1987 |
| JP | 62-73638 | 5/1987 |
| JP | 62-178013 | 8/1987 |
| JP | 62-189816 | 8/1987 |
| JP | 62-73638 | 12/1987 |
| JP | 63-211191 | 9/1988 |
| JP | 63239673 | 10/1988 |
| JP | 63-292488 | 11/1988 |
| JP | 1185160 | 7/1989 |
| JP | 02-190682 | 7/1990 |
| JP | 02-202363 | 8/1990 |
| JP | 3-23590 | 1/1991 |
| JP | 3058379 | 3/1991 |
| JP | 03-086995 | 4/1991 |
| JP | 62-212997 | 9/1997 |
| TW | 434545 | 5/2001 |
| TW | 466490 | 12/2001 |
| TW | 476960 | 2/2002 |
| WO | WO 86/04724 A1 | 8/1986 |
| WO | WO 00/25317 | 5/2000 |

OTHER PUBLICATIONS

Anceau, "Synchronous Approach for Clocking VLSI Systems," IEEE Journal of Solid-State Circuits, vol. SC-17, No. 1, pp. 51-56 (Feb. 1982).

Aoki, Masakazu, et al., "A 1.5V DRAM for Battery-Based Applications," IEEE Journal of Solid-State Circuits, V. 24, No. 5, Oct. 1989, pp. 1206-1212.

Aoki, Masakazu, et al., "New DRAM Noise Generation Under Half-$V_{CC}$ Precharge and its Reduction Using a Transposed Amplifier," IEEE Journal of Solid-State Circuits, V. 24, No. 4, Aug. 1989, pp. 889-894.

Arimoto, Kazutami, et al., "A 60-ns 3.3-V-Only 16-Mbit DRAM with Multipurpose Register," IEEE Journal of Solid-State Circuits, V. 24, No. 5, Oct. 1989, pp. 1184-1189.

Arimoto, Kazutami, et al., "A Speed-Enhanced DRAM Array Architecture with Embedded ECC," IEEE Journal of Solid-State Circuits, V. 25, No. 1, Feb. 1990, pp. 11-17.

Asakura, Mikio, et al., "An Experimental 1-Mbit Cache DRAM with ECC," IEEE Journal of Solid-State Circuits, V. 25, No. 1, Feb. 1990, pp. 5-10.

Asakura, Mikio, et al., "Cell-Plate Line Connecting Complementary Bitline ($C^3$) Architecture for Battery Operating DRAMs," Digest of Technical Papers, Session 7-2, 1991 Symposium on VLSI Circuits, May 30-Jun. 1, 1991, pp. 59-60.

Atsumi, Shigeru, et al., "A 16ns 1 Mb CMOS EPROM," IEEE International Solid States Circuits Conference (Feb. 14, 1990).

Atsumi, Shigeru, et al., "Fast Programmable 256K Read-Only Memory with On-Chip Test Circuits," IEEE International Solid State Circuits (Feb. 1985).

Blalock, Travis, et al., "A High Speed Clamped-Bit-Line Sensing Scheme for IT Dynamic RAMs," Digest of Technical Papers, Session 7-3, 1991 Symposium on VLSI Circuits, May 30-Jun. 1, 1991, pp. 61-62.

Bonges, H.A., III, et al., "A 576k 3.5-ns Access BiCMOS ECL Statis Ram with Array Built-In Self Test," Digest of Technical Papers, Session 2-2, 1991 Symposium on VLSI Circuits, May 30-Jun. 1, 1991, pp. 13-14.

Bursky, D., "Digital Technology," Electronic Design, V. 40, No. 4, pp. 48-61, Feb. 1992.

Bursky, D., "Memory ICs," Electronic Design, V. 36, No. 4, pp. 71-81, Feb. 1988.

Cenker, Ronald P., et al. "A Fault-Tolerant 64K Dynamic RAM," 1979 IEEE International Solid-State Circuits Conference, (ISSCC 79), Session XII: Dynamic Memories, pp. 150-151 and 290, (Feb. 1979).

Chen, "Designing On-Chip Clock Generators," Circuits and Devices, pp. 32-36 (Jul. 1992).

Choi, Yunho, et al., "16-Mb Synchronous DRAM with 125-Mbyte/s Data Rate," IEEE Journal of Solid-State Circuits, vol. 29, No. 4, pp. 529-533 (Apr. 1994).

Choi, Yunho, et al., "16Mbit Synchronous DRAM with 125Mbyte/sec Data Rate," 1993 Symposium on VLSI Circuits, Digest of Technical Papers, pp. 65-66, (1993).

Efendovich, Avner, et al., "Multifrequency Zero-Jitter Delay-Locked Loop," IEEE Journal of Solid-State Circuits, vol. 29, No. 1, pp. 67-70 (Jan. 1994).

Eldin, A.G., et al., "New Dynamic Logic and Memory Circuit Structures for BICMOS Technologies," IEEE Journal of Solid-State Circuits, V. SC-22, No. 3, Jun. 1987, pp. 450-453.

Elmasry, Mohamed, editor. Digital MOS Integrated Circuits II with Applications to Processors and Memory Design, IEEE Press, 1992.

Excerpts from Micron Technology, Inc. 1995 Memory Product Guide. (MC019763-MC019767).

Fujii, S., et al., "A 45ns 16Mb DRAM with Triple-Well Structure," 1989 IEEE International Solid-State Circuits Conference (ISSCC 89), Session 16: Dynamic RAMs, FAM 16.6, pp. 248-249, Feb. 1989.

Fujii, Syuso, et al "A 45-ns 16-Mbit DRAM with Triple-Well Structure," IEEE Journal of Solid-State Circuits, V. 24, No. 5, Oct. 1989, pp. 1170-1174.

Fujii, Syuso, et al., "A 50-μA Standby 1Mx1/256Kx4 CMOS DRAM with High-Speed Sense Amplifier," IEEE Journal of Solid-State Circuits, V. SC-21, No. 5, Oct. 1986, pp. 643-648.

Fukumoto, Katsumi, et al., "A 256K-Bit Non-Volatile PSRAM with Page Recall and Chip Store," Digest of Technical Papers, Session 10-1, 1991 Symposium on VLSI Circuits, May 30-Jun. 1, 1991, pp. 91-92.

Furuyama, Tohru, et al., "An Experimental 4-Mbit CMOS DRAM," *IEEE Journal of Solid-State Circuits*, V. SC-21, No. 5, Oct. 1986, pp. 605-611.

Gasbarro, "Testing High Speed DRAMS," International Test Conference, Paper 13.2, p. 361 (Oct. 1994) (FIN 030541).

Gasbarro, et al., "Techniques for Characterizing DRAMS With a 500 MHz Interface," International Test Conference, Paper 22.2, pp. 516-525 (Oct. 1994) (FIN 030542-551).

Gillingham, Peter, et al., "High-Speed, High-Reliability Circuit Design for Megabit DRAM," IEEE Journal of Solid-State Circuits, V. 26, No. 8, Aug. 1991, pp. 1171-1175.

Gray, Paul R., et al., "MOS Operational Amplifier Design—A Tutorial Overview," *IEEE Journal of Solid-State Circuits*, V. SC-17, No. 6, Dec. 1982, pp. 969-982.

Gray, Paul R., et al., *Analog MOS Integrated Circuits*, II, IEEE Press, 1988, pp. iv-vii, 22-23.

Hidaka, Hideto, et al., "A High-Density Dual-Port Memory Cell Operation for ULSI DRAMs," Digest of Technical Papers, Session 7-5, 1991 Symposium on VLSI Circuits, May 30-Jun. 1, 1991, pp. 65-66.

Hitachi America, Ltd., "Pseudo Static RAM (HM658512 Series) Integrated Circuits Application Note," pp. 1-18, and 20 (1990). (MC011747-MC011768).

Hoffman, William K., et al., "An 8Kb Random-Access Memory Chip Using the One-Device FET Cell," *IEEE Journal of Solid-State Circuits*, V. SC-8, No. 5, Oct. 1973, pp. 298-305.

Hori, Ryoichi, et al., "An Experimental 1 Mbit DRAM Based on High S/N Design," *IEEE Journal of Solid-State Circuits*, V. SC-19, No. 5, Oct. 1984, pp. 634-640.

Horiguchi, M., et al., "Dual-Regulator Dual-Decoding-Trimmer DRAM Voltage Limiter for Burn-In," Digest of Technical Papers, Session 14-2, 1991 Symposium on VLSI Circuits, May 30-Jun. 1, 1991, pp. 127-128.

Horiguchi, Masashi, et al., "A Tunable CMOS-DRAM Voltage Limiter with Stabilized Feedback Amplifier," *IEEE Journal of Solid-State Circuits*, V. 25, No. 5, Oct. 1990, pp. 1129-1135.

Horiguchi, Masashi, et al., "Dual-Operating-Voltage Scheme for a Single 5-V 16-Mbit DRAM," *IEEE Journal of Solid-State Circuits*, V. 23, No. 5, Oct. 1988, pp. 1128-1133.

Horowitz, M., et al., "PLL Design for a 500 MB/s Interface," ISSCC, Digest of Technical Papers, Session 10: High Speed Communication and Interfaces, Paper TP 10.5, pp. 160-161 (Feb. 1993).

IBM Technical Disclosure Bulletin, "High Performance Complementary Decoder/Driver Circuit," V. 29, No. 6, Nov. 1986, pp. 2390-2394.

IBM Technical Disclosure Bulletin, "Improved Decoder Circuits for CMOS Memory Arrays," V. 30, No. 2, Jul. 1987, pp. 664-666.

IBM Technical Disclosure Bulletin, "Positive Level-Shifting Wordline Drivers for DRAMS," vol. 33, No. 2, pp. 187-189 (Jul. 1990).

Integrated Device Technology, Inc., 1991 Static RAM Data Book (1991). (MC019809-MC019822).

Ishibashi, Kochiro, et al., "A 1.7V Adjustable I/O Interface for Low Voltage Fast SRAMs," Digest of Technical Papers, Session 10-4, 1991 Symposium on VLSI Circuits, May 30-Jun. 1, 1991, pp. 97-98.

Ishihara, et al., "256k CMOS Dynamic RAM With Static col. Mode of Cycle Time of 50 ns," Nikkei Electronics, Feb. 11, 1985, pp. 243-263.

Itoh, Kiyoo, "Trends in Megabit DRAM Circuit Design," *IEEE Journal of Solid-State Circuits*, V. 25, No. 3, Jun. 1990, pp. 778-789.

JEDEC Standard, Double Data Rate (DDR) SDRAM Specification, JESD79 (Jun. 2000). (MC019823-MC019899).

JEDEC Standard No. 21-C (2000): See, e.g., §§ 3.11.5. (MC021573-MC021727).

Jeung, Yeun C., "50Mbit/sec. CMOS Video Linestore System," SPIE vol. 1001 Visual Communications and Image Processing, pp. 362-367 (Nov. 1988).

Johns, David A., et al., *Analog Integrated Circuit Design*, John Wiley & Sons, Inc., 1997, pp. 408, 410-411, 442-443.

Johnson, et al., "A Variable Delay Line PLL for CPU-Coprocessor Synchronization," IEEE Journal of Solid-State Circuits, vol. 23, No. 5, pp. 1218-1223 (Oct. 1988) (MTX 010690-95).

Jones, et al., "A New Era of Fast Dynamic RAMS," IEEE Spectrum, Oct. 1992. (MC021305-MC021309).

Kato, H., et al., "Consideration of poly-Si loaded cell capacity limits for each of low-power and high-speed SRAM's," Digest of Technical Papers, Session 10-2, 1991 Symposium on VLSI Circuits, May 30-Jun. 1, 1991, pp. 93-94.

Kawahara, T., et al., "A Circuit Technology for Sub-10ns ECL 4Mb BiCMOS," Digest of Technical Papers, Session 14-4, 1991 Symposium on VLSI Circuits, May 30-Jun. 1, 1991, pp. 131-132.

Keeth, Brent, et al., *DRAM Circuit Design*, Chapter 2, "The DRAM Array," John Wiley & Sons, Inc., 2000, pp. 35-68.

Kimura, Katsutaka, et al., "A 65-ns. 4-Mbit CMOS DRAM with a Twisted Driveline Sense Amplifier," *IEEE Journal of Solid-State Circuits*, V. SC-22, No. 5, Oct. 1987, pp. 651-656.

Kirihata, T., et al., "A Pulsed Sensing Scheme with a Limited Bit-Line Swing," Digest of Technical Papers, Session 7-4, 1991 Symposium on VLSI Circuits, May 30-Jun. 1, 1991, pp. 63-64.

Kitsukawa, G., et al., "A 1-M BiCMOS DRAM Using Temperature-Compensation Circuit Technique," IEEE Journal of Solid-State Circuits, V. 24, No. 3, pp. 597-601, Jun. 1989.

Kitsukawa, Goro, et al "A 1-Mbit BiCMOS DRAM Using Temperature-Compensation Circuit Techniques," IEEE Journal of Solid-State Circuits, V. 24, No. 3, Jun. 1989, pp. 597-601.

Kitsukawa, Goro, et al., "A 23-ns 1-Mb BiCMOS DRAM," IEEE Journal of Solid-State Circuits, V. 25, No. 5, Oct. 1990, pp. 1102-1111.

Kitsukawa, Goro, et al., "An Experimental 1-Mbit BiCMOS DRAM," IEEE Journal of Solid-State Circuits, V. SC-22, No. 5, Oct. 1987, pp. 657-662.

Komatsuzaki, K., et al., "Circuit Techniques for a Wide Word I/O Path 64 Meg DRAM," *1991 IEEE Symposium on VSLI Circuits*, Session 14: Dynamic RAM II, May 30-Jun. 1, 1991, pp. 133-134.

Komatsuzaki, K., et al., "Circuit Techniques for a Wide Word I/O Path 64 Meg DRAM," Digest of Technical Papers, Session 14-5, 1991 Symposium on VLSI Circuits, May 30-Jun. 1, 1991, pp. 133-134.

Kung, Roger I., et al., "An 8K×8 Dynamic RAM with Self-Refresh," IEEE Journal of Solid-state Circuits, vol. SC-17, No. 5, at pp. 863-871, (Oct. 1982). (MC011769-MC011777).

Kuroda, Tadahiro, et al., "Automated Bias Control (ABC) Circuit for High-Performance VLSIs," Digest of Technical Papers, Session 2-3, 1991 Symposium on VLSI Circuits, May 30-Jun. 1, 1991, pp. 15-16.

Kushiyama, Natsuki, et al., "A 500-Megabyte/s Data-Rate 4.5M DRAM," IEEE Journal of Solid-State Circuits, vol. 28, No. 4, pp. 490-498 (Apr. 1993). (FIN 024863-71).

Lee, Thomas H., et al., "A 2.5V Delay-Locked Loop for an 18Mb 500MB/s DRAM," IEEE International Solid State Circuits Conference, Session 18: High Performance Logic and Circuit Techniques, Paper FA 18.6, pp. 300-301 (Feb. 18, 1994) (FIN 30552-031143).

Lee, Thomas H., et al., FA18.6: "A 2.5V Delay-Locked Loop for an 18Mb 500MB/s DRAM," 1991 IEEE International Solid State Circuits Conference, p. 300.

"Lines '703 Prior Art," MOSAID00050393.

Lu, N.C.C., et al., "A 20-ns. 128-kbit×4 High-Speed DRAM with 330-Mbit/s Data Rate", IEEE Journal of Solid-State Circuits, V. 23, No. 5, pp. 1140-1149, Oct. 1988.

Lu, N.C.C., et al., "A 20ns 512Kb DRAM with 83MHz Page Operation" 1989 IEEE International Solid-State Circuits Conference (ISSCC 88), Session XVI: Dynamic Memory, FAM 16.3, Feb. 1988.

Martin, Ken, et al., "Effects of the Op Amp Finite Gain and Bandwidth on the Performance of Switched-Capacitor Filters," *IEEE Transactions on Circuits and Systems*, V. CAS-28, No. 8, Aug. 1981, pp. 134-141.

Masuoka, Fujio, et al., "A 256-kbit Flash $E^2$ PROM Using Triple-Polysilicon Technology," *IEEE Journal of Solid-State Circuits*, V. SC-22, No. 4, Aug. 1987, pp. 548-552.

Memory Data Book, "Pseudo-Static RAMS" pp. 2-1 through 2-50, 1993 Sharp Electronics Corp., P.O. Box 19086, Portland, OR 97280. (MC021157-MC021206).

Menasce, et al., "A Fully Digital Phase Locked Loop," Canadian Conference on VLSI, pp. 9.4.1-9.4.8 (Oct. 1990) (FIN 029869-876).

Micron Technology, Inc., Advance Data Sheet, "MT48LC4M4R1 (S) 4 Meg X 4 Meg SDRAM" (1994) (MC020053-MC020094).

Micron Technology, Inc., Advance Data Sheet, "Synchronous Graphics RAM, 256K×32 SGRAM, MT41LC256K32D4(S)" 1995 DRAM Data Book (MC019915-MC019953).

Min, Dong-Sun, et al., "Temperature-Compensation Circuit Techniques for High-Density CMOS DRAMs," Digest of Technical Papers, Session 14-1, 1991 Symposium on VLSI Circuits, May 30-Jun. 1, 1991, pp. 125-126.

Miyamoto, Jun-Ichi, et al., "An Experimental 5-V-Only 256-kbit CMOS EEPROM with a High-Performance Single-Polysilicon Cell," IEEE Journal of Solid-State Circuits, V. SC-21, No. 5, Oct. 1986, pp. 852-861.

Momodomi, Masaki, et al., "An Experimental 4-Mbit CMOS EEPROM with a NAND-Structured Cell," IEEE Journal of Solid-State Circuits, V. 24, No. 5, Oct. 1989, pp. 1238-1243.

Motorola, Inc., "32K×9 Bit BurstRAM™ Synchronous Static RAM," Fast Static RAM BiCMOS, CMOS, and Module Data, at pp. 4-67 to 4-100, (1993). (MC011778-MC011802).

Nakagome, Y., et al, "An Experimental 1.5-V 64-Mb DRAM," IEEE Journal of Solid-State Circuits, V. 26, No. 4, pp. 465-472, Apr. 1991.

Nakagome, Y., et al., "A 1.5V Circuit Technology for 64Mb DRAMs," 1990 Symposium on VLSI Circuits, Honolulu, Hawaii, pp. 17-18, Jun. 1990.

Nakagome, Yoshinobu, et al, "An Experimental 1.5-V 64-Mb DRAM," IEEE Journal of Solid-State Circuits, V. 26, No. 4, Apr. 1991, pp. 465-472.

Nakagome, Yoshinobu, et al., "Circuit Techniques for 1.5-3.6-V Battery-Operated 64-Mb DRAM," IEEE Journal of Solid-State Circuits, V. 25, No. 7, Jul. 1991, pp. 1003-1010.

Nambu, Hiroaki, et al., "A 1.5ns, 64Kb EDL-CMOS SRAM," Digest of Technical Papers, Session 2-1, 1991 Symposium on VLSI Circuits, May 30-Jun. 1, 1991, pp. 11-12.

NEC, PLL Enable Mode, JC-42.3 (Sep. 13, 1994) (FIN 23323, 23326, 23329).

Nogami, Kazutaka, et al.,"1-MBit Virtually Static RAM," IEEE Journal of Solid-State Circuits, vol. SC-21, No. 5, at pp. 662-669, (Oct. 1986). (MC011803-MC011810).

Ohta, Kiyoto, et al., "A 1-Mbit DRAM with 33-MHz Serial I/O Ports," IEEE Journal of Solid-State Circuits, V. SC-21, No. 5, Oct. 1986, pp. 649-654.

Press Release, "Toshiba Announces Industry's First 64MB Pseudo SRAM Family," (Sep. 20, 2001). (MC019967-MC013368).

Press Release, "Toshiba Announces the World's First 64-Megabit Pseudo SRAMs," (Sep. 20, 2001). (MCO20107-MCO20108).

Pribyl, W., et al., "New Concepts for Wordline Driving Circuits in CMOS Dynamic Random Access Memories," Fourteenth European Solid-State Circuites Conference UMIST, Manchester UK, Sep. 21-23, 1988, IBM 000226-000231.

Prince, Betty, "Semiconductor Memories: A Handbook of Design, Manufacture, and Application," 2nd Edition; John Wiley & Sons, New York, (Reprinted Jun. 1997). (MC011811-MC011839).

Przybylski, Steven, "New DRAM Technologies" MicroDesign Resources, Sebastopol, CA (1994) (FIN 030552-031143).

Rambus Product Catalog, 1993 (000089-98).

Rambus RDRAM Reference Manual, 1993 (RM0000117-122).

Reverse Engineering full report—"An Analysis of the Toshiba TC511000/TC511001 CMOS 1Mx1 DRAMs," MOSAID, Aug. 1986.

Reverse Engineering report—"An Analysis of the Toshiba TC511000/TC511001 Cmos 1Mx1 DRAMs," MOSAID, Aug. 1986.

Reverse Engineering report—"A Design Analysis of the TMS4164," MOSAID, Aug. 1987.

Reverse Engineering report—"An Analysis of the i2164A," MOSAID, Apr. 1982.

Reverse Engineering report—Samsung KM44C4100BS-7, 6 pgs.

Reverse Engineering report—Samsung KM44S64230At-GL.

Saito, Shozo, et al., "A 1-Mbit CMOS DRAM with Fast Page Mode and Static Column Mode," IEEE Journal of Solid-State Circuits, V. SC-20, No. 5, Oct. 1985, pp. 903-908.

Samachisa, Gheorghe, et al., "A 128K Flash EEPROM Using Double-Polysilicon Technology," IEEE Journal of Solid-State Circuits, V. SC-22, No. 5, Oct. 1987, pp. 676-683.

Samsung Electronics 2001 Annual Report at pp. 6 and 7. (MC019969-MC020039).

Sawada, Kazuhiro, et al., "A 30-μA Data-Retention Pseudostatic RAM with Virtually Static RAM Mode," IEEE Journal of Solid-State Circuits, vol. 23, No. 1, at pp. 12-19, (Feb. 1988). (MC011843-MC011850).

Schanke, "Proposal for Clock Distribution in SCI," May 5, 1989 (FIN 30526-530).

Schematics of Micron 1Mx4 DRAM MT4C4001DJ-8, May 30, 1991.

Scheuerlein, Roy E., et al., "Offset Word-Line Architecture for Scaling DRAM's to the Gigabit Level," IEEE Journal of Solid-State Circuits, V. 23, No. 1, Feb. 1988, pp. 41-47.

Scheuerlein, Roy E., et al., "Shared Word Line DRAM Cell," IEEE Journal of Solid-State Circuits, V. SC-19, No. 5, Oct. 1984, pp. 640-645.

Sidiropoulos, et al., "A CMOS 500 Mbps/pin synchronous point to point link interface," Symposium on VLSI Circuits, Digest of Technical Papers, pp. 43-44 (Jun. 1994) (FIN 030531-32).

Takada, Masahide, et al., "A 4-Mbit DRAM with Half-Internal-Voltae Bit-Line Precharge," IEEE Journal of Solid-State Circuits, V. SC-21, No. 5, Oct. 1986, pp. 612-617.

Takai, Y., et al., "250 Mbyte/sec Synchronous DRAM Using a 3-Stage-Pipelined Architecture," 1993 Symposium on VLSI Circuits, Digest of Technical Papers, pp. 59-60 (1993).

Takai, Yasuhiro, et al., "250 Mbyte/s Synchronous DRAM Using a 3-Stage-Pipelined Architecture," IEEE Journal of Solid-State Circuits, vol. 29, No. 4, pp. 426-431 (Apr. 1994).

Takao, Y., et al., "A Low-Power SRAM Utilizing High On/Off Ratio Laser-Recrystallized SOI PMOSFET," Digest of Technical Papers, Session 10-3, 1991 Symposium on VLSI Circuits, May 30-Jun. 1, 1991, pp. 95-96.

Takashima, Daisaburo, et al., "Word-Line Architecture for Constant Reliability 64Mb DRAM," Digest of Technical Papers, Session 7-1, 1991 Symposium on VLSI Circuits, May 30-Jun. 1, 1991, pp. 57-58.

Takeshima, Toshio, et al., "Voltage Limiters for DRAM's with Substrate-Plate-Electrode Memory Cells," IEEE Journal of Solid-State Circuits, V. 23, No. 1, Feb. 1988, pp. 48-52.

Tamaki, Satoshi, et al., "14 μA Data Retention DRAM with Intermittent Bit-Line Balancing Scheme," Digest of Technical Papers, Session 14-3, 1991 Symposium on VLSI Circuits, May 30-Jun. 1, 1991, pp. 129-130.

Tanaka, S. et al., "A Programmable 256K CMOS EPROM with On-Chip Test Circuits," International Solid-State Circuits Conference (ISSCC 84), Session X: Nonvolatile Memories, THAM 10.7, pp. 148-149 (Feb. 1984).

Texas Instruments, Memory Products Development, "16Mbit DRAM Crib Notes," Jul. 1990, pp. 12-13.

Urukawa, Yukihiro, et al., "Data-Line Wiring Delay Reduction Techniques for High-Speed BiCMOS SRAM's," Digest of Technical Papers, Session 2-5, 1991 Symposium on VLSI Circuits, May 30-Jun. 1, 1991, pp. 19-20.

U.S. Patent Application for Delay Locked Loop (DLL) Implementation in a Synchronous Dynamic Random Access Memory (SDRAM), MOSAID Technologies Incorporated, Semiconductor Division (Sep. 29, 1994) (MTI 118756-768).

Wagner, et al "Testable Programmable Digital Clock Pulse Control Elements," International Test Conference at 902, 1993 (FIN 030533-540).

Wang, Niantsu, Digital MOS Integrated Circuits—Design for Applications, Prentice Hall, 1990, pp. 240-245.

Watanabe, T., et al., "Comparison of CMOS and BiCMOS 1-Mbit DRAM Performance," IEEE Journal of Solid-State Circuits, V. 24, No. 3, pp. 771-778, Jun. 1989.

Weste, Neil H. E., et al., "Principles of CMOS VLSI Design," Addison-Wesley Publishing Company, p. 13 (1998).

Witters, Johan S., et al., "Analysis and Modeling of On-Chip High-Voltage Generator Circuits for Use in EEPROM Circuits," IEEE Journal of Solid-State Circuits, V. 24, No. 5, Oct. 1989, pp. 1372-1380.

Young, I., et al., "A High Performance 256K TTL SRAM Using 0.8um Triple-Diffused BiCMOS With 3V Circuit Techniques," Digest of Technical Papers, Session 2-4, 1991 Symposium on VLSI Circuits, May 30-Jun. 1, 1991, pp. 17-18.

Summary Judgement Opinion, United States District Court for the District of New Jersey (Samsung and Infineon), Apr. 1, 2005.
Summary Judgement Order, United States District Court for the District of New Jersey (Samsung and Infineon), Apr. 1, 2005.
MOSAID's Brief in Support of its Motions for Summary Judgment Against Samsung and Infineon, Nov. 12, 2004.
MOSAID's Local Rule 56.1 Statement of Undisputed Facts (Samsung and Infineon), Nov. 12, 2004.
Infineon Technologies North America Corp. et al.'s Memorandum in Opposition to MOSAID's Motions for Summary Judgment Against Infineon, Nov. 22, 2004.
Infineon Technologies North America Corp. et al.'s Local Rule 56.1 Statement of Material Facts in Opposition to MOSAID's Motions for Summary Judgment, Nov. 29, 2004.
MOSAID's Reply Brief in Further Support of its Motion for Summary Judgment Against Infineon as to Non-Infringement and Affirmative Defenses of Invalidity and Unenforceability Against Samsung and Infineon, Nov. 29, 2004.
Jan. 12, 1990 Fast 1Mbit Mentor Schematics.
Jan. 29, 1990 fax.
Feb. 9, 1990 OEM Agreement in Principle.
Feb. 9, 1990 Fax from MOSAID to Sanyo.
Feb. 19, 1990 Design License Agreement.
Feb. 19, 1990 Fax from MOSAID to Sanyo.
Feb. 21, 1990 Fax from MOSAID to Sanyo.
Sep. 7, 1990 Letter from Sanyo to MOSAID.
May 20, 1992 MOSAID Purchase Order.
Jul. 9, 1996 Sanyo-MOSAID Meeting. Agenda.
Apr. 17, 2003 Gillingham Deposition.
May 13, 2003 Foss Deposition.
Jun. 18, 2003 Goto Deposition.
May 20, 2004 Foss Deposition.
May 28, 2004 Scott Deposition.
MOSAID's Complaint [against Samsung], filed in 01-04340, on Sep. 13, 2001.
Defendants' Amended Objections and Responses to MOSAID's First Set of Interrogatories, served in 01-04340, on Jun. 13, 2002.
Defendants' First Supplemental Responses to MOSAID's Second Set of Interrogatories, served in 01-04340, on Feb. 6, 2003.
Defendants' Objections and Responses to MOSAID's Third Set of Interrogatories, served in 01-04340 (D. NJ), on Feb. 6, 2003.
MOSAID's Second Amended Complaint filed in consolidated NJ action, C. A. No. 01-4340, on Oct. 14, 2003.
MOSAID's Second Amended Complaint filed in consolidated NJ action, C. A. No. 01-4340, on Oct. 28, 2003.
Infineon's Reply and Answer to MOSAID's Third Amended Counterclaims and Related Counter Counterclaims, filed in consolidated NJ action, C. A. No. 03-04698, on Oct. 29, 2003.
Opinion re. Claim Construction, entered in 01-04340 and 03-04698, on Mar. 22, 2004.
Order re. Claim Construction, entered in 01-04340 and 03-04698, on Mar. 22, 2004.
Stipulated Order Dismissing Claims Without Prejudice, filed in 03-04698, on May 25, 2004 (as to claims related to U.S. Patent No. 6,067,272, only).
Opinion re. MOSAID's Motion for Reconsideration of Claim Construction rulings—Denied, entered in 01-04340 and 03-04698, on Jun. 14, 2004.
Order Denying MOSAID's Motion for Reconsideration of Claim Construction rulings, entered in 01-04340 and 03-04698, on Jun. 14, 2004.
Preliminary Expert Report of Joseph C. McAlexander Regarding Invalidity of MOSAID Patents, served in 03-04698, on Oct. 15, 2004.
Supplemental Expert Report of Joseph C. McAlexander Regarding Invalidity of MOSAID Patents, served in 03-04698, on Oct. 28, 2004.
Order of Dismissal, entered in 01-04340, on Jan. 31, 2005.
Infineon's Complaint for Declaratory Judgment, filed in 02-05772, on Dec. 11, 2002.
Defendant MOSAID Technologies Incorporated's Amended Answer and Counterclaims, filed in 02-05772, on May 30, 2003.
Defendant MOSAID Technologies Incorporated's Third Amended Answer and Counterclaims, filed in 01-04340 (D. NJ), consolidated with 02-05772 (N.D. CA), on Jul. 14, 2005.

Stipulated Motion for Dismissal With Prejudice, filed in 02-05772, on Mar. 2, 2007.
Order Dismissing All Remaining Claims and Counterclaims Pursuant to Parties' Stipulation, entered in 02-05772, on Mar. 7, 2007.
Judgment (dismissing action and closing file), entered in 02-05772, on Mar. 7, 2007.
Complaint for Declaratory Judgment and Demand for Jury Trial against MOSAID Technologies Incorporated, filed in 06-04496 (N. D. CA), on Jul. 24, 2006.
Order Granting MOSAID's Motion to Dismiss for Lack of Subject Matter Jurisdiction, entered in 06-04496, on Oct. 23, 2006.
Complaint for Patent Infringement, filed by MOSAID Technologies, Inc., in 06-00302 (E. D. TX), on Jul. 25, 2006.
First Amended Complaint for Patent Infringement, filed by MOSAID Technologies, Inc., in 06-00302, on Aug. 31, 2006.
Second Amended Complaint for Patent Infringement, filed by MOSAID Technologies, Inc., in 06-00302, on Dec. 15, 2006.
Defendant Micron Technology, Inc.'s Answer to Second Amended Complaint and Counterclaims, filed in 06-00302, on Jan. 31, 2007.
Defendant ProMOS's Answer, Affirmative Defenses, and Counterclaims to MOSAID's Second Amended Complaint, filed in 06-00302, on Feb. 6, 2007.
Defendant Powerchip's Answer, Defenses, and Counterclaims to MOSAID's Second Amended Complaint, filed in 06-00302, on Feb. 7, 2007.
Defendant Powerchip's Amended Answer, Defenses, and Counterclaims to MOSAID's Second Amended Complaint, filed in 06-00302, on Feb. 22, 2007.
Plaintiff MOSAID Technologies, Inc.'s Reply to Counter-Plaintiff ProMOS Technologies' Counterclaims, filed in 06-00302, on Mar. 12, 2007.
Plaintiff MOSAID Technologies, Inc.'s Reply to Counter-Plaintiff Powerchip Semiconductor Corp.'s Amended Counterclaims, filed in 06-00302, on Mar. 12, 2007.
Plaintiff MOSAID Technologies, Inc.'s Reply to Counter-Plaintiff Micron Technology, Inc.'s Counterclaims, filed in 06-00302, on Mar. 23, 2007.
Defendant Mosel Vitelic, Inc.'s Answer, Affirmative Defenses and Counterclaims to MOSAID's Second Amended Complaint, filed in 06-00302, on Mar. 30, 2007.
Defendant ProMOS's Amended Answer, Affirmative Defenses, and Counterclaims to MOSAID's Second Amended Complaint, filed in 06-00302, on Apr. 10, 2007.
Plaintiff MOSAID Technologies, Inc.'s Reply to Counter-Plaintiff Mosel Vitelic, Inc.'s Counterclaims, filed in 06-00302, on Apr. 23, 2007.
Plaintiff MOSAID Technologies, Inc.'s Reply to Counter-Plaintiff ProMOS Technologies' Amended Counterclaims, filed in 06-00302, on Apr. 27, 2007.
Order Granting Micron Technology, Inc.'s Amended Motion to Dismiss its Counterclaim for Infringement of U.S. Patent No. 6,446,021, entered in 06-00302, on Jul. 10, 2007.
Notice of Service [of Defendant Powerchip's Invalidity Contentions], filed in 06-00302, on Aug. 13, 2007.
Notice of Service [of Defendant ProMOS Technologies, Inc.'s Invalidity Contentions], filed in 06-00302, on Aug. 13, 2007.
Notice of Service [of Defendant Mosel Vitelic, Inc.'s Preliminary Invalidity Contentions], filed in 06-00302, on Aug. 13, 2007.
Defendant Micron Technology, Inc.'s Notice of Compliance with P.R. 3-3 and 3-4, filed in 06-00302, on Aug. 14, 2007.
Plaintiff MOSAID Technologies, Inc.'s Sep. 5, 2007 Identification of Patent Claims, filed in 06-00302, on Sep. 5, 2007.
MOSAID—Sanyo Technical Cooperation Agreement dated May 3, 1988, and signed on Jun. 13, 1988.
Fax correspondence dated Aug. 11, 1988, from R. Phillips at MOSAID to Y. Imai at Sanyo, enclosing report on the Toshiba TC511000AP Fast 1Mbit DRAM Process Analysis.
Fax correspondence dated Aug. 24, 1988 from T. Wada at Sanyo to Dr. Foss and R. Phillips at MOSAID, discussing June meeting agenda.
"MOSAID-Sanyo Fast 1Mbit DRAM Design: Preliminary Design Feasibility Study," dated Sep. 16, 1988. Prepared by MOSAID for Sanyo.

"Sanyo Fast 1M DRAM Progress Report, Feb. 1989," Prepared by MOSAID Memory Design and Technology Services.
"Sanyo Fast 1M DRAM Progress Report, Apr. 1989," Prepared by MOSAID Memory Design and Technology Services.
Internal MOSAID fax correspondence dated Jun. 21, 1989, from Ruth Maxwell to Dr. R. C. Foss re. scheduling.
Fax correspondence dated Jun. 30, 1989, from Russ Fields at MOSAID to Aid Goto at Sanyo, attaching draft Business Plan.
Fax correspondence dated Sep. 27, 1989, from Dr. Richard Foss at MOSAID to AidGoto at Sanyo, attaching draft proposal.
Fax correspondence dated Feb. 7, 1990, from Iain Scott at MOSAID to Tracey Connelly at Sanyo re. proposed visit to Japan.
Fax correspondence dated Feb. 7, 1990, from Iain Scott at MOSAID to Akifumi Goto at Sanyo re. visit to Japan.
Minutes of Meeting dated Feb. 26, 1990 between Sanyo and MOSAID.
Minutes of Meeting dated Feb. 27, 2000 between Sanyo and MOSAID.
"Sanyo Fast 1M DRAM Final Documentation—Sections 5 and 6, Apr. 1990." Prepared by MOSAID.
"Sanyo Fast 1M DRAM Final Documentation, Apr. 1990." Prepared by MOSAID.
Defendant Mosel Vitelic, Inc.'s Preliminary Invalidity Contentions, filed in *MOSAID Technologies, Inc.* v. *Micron Technology, Inc., et al.*, Civil Action No. 06-00302, on Aug. 13, 2007.
Defendant ProMOS Technologies, Inc.'s Preliminary Invalidity Contentions, filed in *MOSAID Technologies, Inc.* v. *Micron Technology, Inc., et al.*, Civil Action No. 06-00302, on Aug. 13, 2007.
Micron's Invalidity Contentions Pursuant to Patent Rule 3-3, filed in *MOSAID Technologies, Inc.* v. *Micron Technology, Inc., et al.*, Civil Action No. 06-00302, on Aug. 13, 2007.
Defendant Powerchip Semiconductor Corp.'s Invalidity Contentions Pursuant to Local Patent Rule 3-3, filed in *MOSAID Technologies, Inc.* v. *Micron Technology, Inc., et al.*, Civil Action No. 06-00302, on Aug. 13, 2007.
Stipulation Dismissing With Prejudice Claims Between Plaintiff MOSAID and Defendants ProMos and Mosel, entered in *MOSAID Technologies, Inc.* v. *Micron Technology, Inc.*, Civil Action No. 08-4494-JF, N.D. Cal., on Feb. 8, 2008.
Order Dismissing With Prejudice Claims Between Plaintiff MOSAID and Defendants ProMos and Mosel, entered in *MOSAID Technologies, Inc.* v. *Micron Technology, Inc.*, Civil Action No. 08-4494-JF, N.D. Cal., on Feb. 13, 2008.
Judgment of the U.S. Court of Appeals for the Federal Circuit reversing dismissal and remanding case back to Northern District of California in *Micron, et al.* v. *MOSAID Technologies, Inc.*, Civil Action No. 06-04496-JF, N.D. Cal., on Feb. 29, 2008.
Order of Court, entered on Jul. 2, 2008, in *MOSAID Technologies, Inc.* v. *Micron Technology, Inc., et al.*, Civil Action No. 06-00302, and dismissing Defendants' Motions to Stay and Granting Defendants' Motions to Transfer and Change Venue. Case transferred to N.D. California.
Micron's First Amended Complaint for Declaratory Judgment, filed in *Micron, et al.* v. *MOSAID Technologies, Inc.*, Civil Action No. 06-04496-JF, N.D. Cal., on Jul. 28, 2008.
PowerChip's First Amended Complaint in Intervention for: Declaration of Noninfringement, Invalidity, Unenforceability, and/or License, filed in *Micron, et al.* v. *MOSAID Technologies, Inc.*, Civil Action No. 06-04496-JF, N.D. Cal., on Aug. 12, 2008.
Mosaid's Answer, Affirmative Defenses and Counterclaims to Micron's First Amended Complaint for Declaratory Judgment, filed in *Micron, et al.* v. *MOSAID Technologies, Inc.*, Civil Action No. 06-04496-JF, N.D. Cal., on Aug. 14, 2008.
Mosaid's Notice of Compliance with the May 21, 2008 Order Granting Mosaid Leave to Amend and/or Supplement Preliminary Infringement Contentions, filed in *Micron, et al.* v. *MOSAID Technologies, Inc.*, Civil Action No. 06-04496-JF, N.D. Cal., on Aug. 25, 2008.
Mosaid's Answer, Defenses, and Counterclaims to Powerchip's First Amended Complaint in Intervention, filed in *Micron, et al.* v. *MOSAID Technologies, Inc.*, Civil Action No. 06-04496-JF, N.D. Cal., on Aug. 29, 2008.

Micron's Answer to MOSAID's Counterclaims, filed in *Micron, et al.* v. *MOSAID Technologies, Inc.*, Civil Action No. 06-04496-JF, N.D. Cal., on Sep. 8, 2008.
Powerchip's Answer to MOSAID's Counterclaims, filed in *Micron, et al.* v. *MOSAID Technologies, Inc.*, Civil Action No. 06-04496-JF, N.D. Cal., on Sep. 18, 2008.
PACER Docket Report in the matter of *MOSAID Technologies, Inc.* v. *Micron Technology, Inc., et al.*, Civil Action No. 06-00302, showing transfer of case to Northern District of California on Oct. 7, 2008 and assignment of docket No. 08-4494.
Related Case Order relating 06-04496 (*Micron Technology, Inc.* v. *MOSAID Technologies, Inc.*) and 08-04494 (*Mosaid Technologies, Inc.* v. *Micron Technology, Inc., et al.*), entered on Oct. 15, 2008.
Stipulation Dismissing With Prejudice Claims Between Plaintiff MOSAID and PowerChip, entered in *MOSAID Technologies, Inc.* v. *Micron Technology, Inc.*, Civil Action No. 08-4494-JF, N.D. Cal., on Oct. 31, 2008.
Order Dismissing With Prejudice Claims Between MOSAID and PowerChip, entered in *MOSAID Technologies, Inc.* v. *Micron Technology, Inc.*, Civil Action No. 08-4494-JF, N.D. Cal., on Nov. 4, 2008.
Order Dismissing With Prejudice Claims Between MOSAID and PowerChip, entered in *Micron, et al.* v. *MOSAID Technologies, Inc.*, Civil Action No. 06-04496-JF, N.D. Cal., on Nov. 4, 2008.
Micron's Unopposed Submission of a Chart to Reflect Micron's Claim Construction Positions (and accompanying Exhibit A—Claim Construction Chart) filed in *Micron, et al.* v. *MOSAID Technologies, Inc.*, Civil Action No. 06-04496-JF, N.D. Cal., on Dec. 4, 2008.
Stipulation Dismissing With Prejudice Between MOSAID and Micron, filed in *Micron, et al.* v. *MOSAID Technologies, Inc.*, Civil Action No. 06-04496-JF, N.D. Cal., on Feb. 2, 2009.
Order Dismissing With Prejudice Claims Between MOSAID and Micron, entered in *Micron, et al.* v. *MOSAID Technologies, Inc.*, Civil Action No. 06-04496-JF, N.D. Cal., on Feb. 5, 2009.
Stipulation Dismissing With Prejudice Claims Between MOSAID and Micron, entered in *MOSAID Technologies, Inc.* v. *Micron Technology, Inc.*, Civil Action No. 08-4494-JF, N.D. Cal., on Feb. 2, 2009.
Order Dismissing With Prejudice Claims Between MOSAID and Micron, entered in *MOSAID Technologies, Inc.* v. *Micron Technology, Inc.*, Civil Action No. 08-4494-JF, N.D. Cal., on Feb. 5, 2009.
Elliott, et al., "Computational Ram: A Memory-SIMD Hybrid and its Application to DSP," *The Proceedings of the Custom Integrated Circuits Conference, paper 361* (May 3-6, 1992).
Furuyama, et al., "An Experimental 2-Bit/Cell Storage DRAM for Macro Cell or Memory-On-Logic Application," *Custom Integrated Circuits Conference*, pp. 4.4.1-4.4.4 (May 16-19, 1988).
Iizuka, et al., "Large Memory Embedded ASICs," *Proceedings of the 1988 IEEE International Conference on Computer Design: VLSI in Computers and Processors*, pp. 292-295 (Oct. 3-5, 1988).
Kalter, et al., "A 50-ns. 16-Mb DRAM with a 10-ns Data Rate and On-Chip ECC" IEEE Journal of Solid-State Circuits, vol. 25, No. 5 (Oct. 1990).
Sakurai, ct al., A 1Mb Virtually SRAM, *IEEE International Solid-State Circuits Conference, Session XVIII*, pp. 252-253 and 364 (Feb. 21, 1986).
Sawada, et al., "A 72K CMOS Channelless Gate Array with Embedded 1Mbit Dynamic RAM," *The Proceedings of the IEEE Custom Integrated Circuits Conference*, pp. 20.3.1-20.3-4 (May 16-19, 1988).
Sawada, et al, " A 5ns 369kb Port-Configurable Embedded SRAM with 0.5um CMOS Gate Array," *IEEE International Solid-State Circuits Conference, Session 14: DRAM and Embedded Memory*, pp. 226-227 (Feb. 16, 1990).
"Defendant International Business Machines Corporation's Answer, Demand for Jury Trial and Counterclaims," *United States District Court of Delaware, Mosaid Technologies Incorporated* v. *International Business Machines Corporation*, Case No. 09-510 (GMS), Sep. 2, 2009.
"Plaintiff Mosaid Technologies Inc.'s Reply to Defendant Internatioal Business Machine Corporation's Counterclaims," *United States District Court of Delaware, Mosaid Technologies Incorporated* v. *International Business Machines Corporation*, Case No. 09-510-GMS, Sep. 25, 2009.

* cited by examiner

DYNAMIC MEMORY WORD LINE DRIVER SCHEME

RELATED APPLICATION(S)

This application is a continuation of U.S. application Ser. No. 11/396,306, filed on Mar. 30, 2006, now U.S. Pat. No. 7,535,749 which is a Continuation of application Ser. No. 10/791,437, filed on Mar. 2, 2004, now U.S. Pat. No. 7,038,937 which is a Continuation of application Ser. No. 10/463,194, filed on Jun. 17,2003, now abandoned, which is a Continuation of application Ser. No. 09/919,752, filed on Jul. 31, 2001, now U.S. Pat. No. 6,603,703, which issued on Aug. 5, 2003, which is a Continuation of application Ser. No. 09/548,879, filed on Apr. 13, 2000, now U.S. Pat. No. 6,278,640, which issued on Aug. 21, 2001, which is a Continuation of application Ser. No. 09/123,112, filed on Jul. 27, 1998, now U.S. Pat. No. 6,061,277, which issued on May 9, 2000, which is a Continuation of application Ser. No. 08/705,534, filed on Aug. 29, 1996, now abandoned, which is a Continuation of application Ser. No. 08/611,558, filed on Mar. 6, 1996, now U.S. Pat. No. 5,751,643, which issued on May 12, 1998, which is a Continuation-in-Part of application Ser. No. 08/515,904, filed on Aug. 16, 1995, now U.S. Pat. No. 5,822,253, which issued on Oct. 13, 1998, which is a Continuation of application Ser. No. 08/205,776, filed on Mar. 3, 1994, now abandoned, which is a File Wrapper Continuation of application Ser. No. 08/031,898, filed on Mar. 16, 1993, now abandoned, which is a Continuation of application Ser. No. 07/680,746, filed on Apr. 5, 1991, now U.S. Pat. No. 5,214,602, which issued on May 25, 1993, which relates to Japanese Application No. 9107165, filed on Apr. 5, 1991 and United Kingdom Application No. 9007790.0, filed on Apr. 6, 1990. The entire teachings of the above applications are incorporated herein by reference.

FIELD OF THE INVENTION

This invention relates to CMOS dynamic random access memories (DRAMs), and particularly to word line drivers.

BACKGROUND TO THE INVENTION

Dynamic random access memories are generally formed of a matrix of bit lines and word lines with memory cells located adjacent the intersections of the bit lines and word lines. The memory cells are enabled to provide their stored bits to the bit lines or to permit a write operation by signals carried on the word lines.

Each memory cell is typically formed of a bit storage capacitor connected to a reference voltage and through the source-drain circuit of an "access" field effect transistor to an associated bit line. The gate of the field effect transistor is connected to the word line. A logic signal carried by the word line enables the transistor, thus allowing charge to flow through the source-drain circuit of the transistor to the capacitor, or allowing charge stored on the capacitor to pass through the source-drain circuit of the access transistor to the bit line.

In order for the logic level $V_{dd}$ potential from the bit line to be stored on the capacitor, the word line must be driven to a voltage above $V_{dd}+V_{tn}$, where $V_{tn}$ is the threshold voltage of the access transistor including the effects of back bias.

During the early days of DRAM design, NMOS type FETs, that is, N-channel devices were used exclusively. In order to pass a $V_{dd}+V_{tn}$ level signal to the selected word line, the gate of the pass transistor had to be driven to at least $V_{dd}+2V_{tn}$. Furthermore, to allow sufficient drive to achieve a voltage greater than $V_{dd}+V_{tn}$ on the word line within a reasonable length of time in order to facilitate a relatively fast memory, the gate of the pass transistor is driven to a significantly higher voltage. In such devices, the word line driving signal utilized capacitors in a well-known double-boot strap circuit.

In the above circuit, the boot strapping voltage circuit is designed to exceed the voltage $V_{dd}+2V_{tn}$, in order to ensure that temperature, power supply, and process variations would never allow the pass transistor driving voltage to fall below $V_{dd}+2V_{tn}$.

However, it has been found that in small geometry VLSI memories, the high voltages provided by the boot-strap circuits can exceed the tolerable voltages in the memory, thus adversely affecting reliability.

SUMMARY OF THE INVENTION

The present invention is a circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained.

According to an embodiment of the invention a dynamic random access memory (DRAM) is comprised of word lines, memory cells having enable inputs connected to the word lines, apparatus for receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines for application to the enable inputs whereby an above $V_{dd}$ voltage level word line is achieved without the use of double boot-strap circuits.

According to another embodiment, a dynamic random access memory (DRAM) is comprised of bit lines and word lines, memory cells connected to the bit lines and word lines, each memory cell being comprised of an access field effect transistor (FET) having its source-drain circuit connected between a bit line and a bit charge storage capacitor, the access field effect transistor having a gate connected to a corresponding word line; a high supply voltage source $V_{pp}$; a circuit for selecting the word line and a circuit having an input driven by the selecting apparatus for applying the $V_{pp}$ supply voltage to the word line.

BRIEF INTRODUCTION TO THE DRAWINGS

A better understanding of the invention will be obtained by reference to the detailed description below, in conjunction with the following drawings, in which:

FIG. 1 is a schematic diagram of the invention.

DESCRIPTION OF A PREFERRED EMBODIMENT OF THE INVENTION

Turning now to FIG. 1, a CMOS DRAM is comprised of word lines, represented by word line 1 and bit lines, represented by bit lines 2A, 2B, etc. Access transistors 3A, 3B have their gates connected to the word line; their sources are connected to bit charge storing capacitors 4A, 4B, etc. which are also connected to ground. The drains of access transistors 3A, 3B, etc. are connected to the bit lines 2A, 2B, etc.

With the application of a logic signal of $V_{dd}+V_{tn}$ to the gate of transistor 3A, 3B, etc., $V_{dd}$ level on the-bit line 2A, 2B, etc. is fully transferred to the associated capacitor 4A, 4B, etc. during the writing cycle. In the prior art it was necessary to apply a voltage greater than $V_{dd}+2V_{tn}$ to the gate of an N-channel pass transistor in order to ensure that a voltage in excess of $V_{dd}+V_{tn}$ would be available at the gates of transistors 3A, 3B, etc.

The combination of a bit storing charge capacitor, e.g. 4A, with an associated access transistor, e.g. 3A, forms a memory cell in prior art DRAMs.

The word line is selected by means of addresses $A_{ij}$ applied to the inputs of a NAND gate 5. In the prior art a double boot-strap circuit was connected between the output of NAND gate 5 and the word line.

In accordance with the present invention a voltage $V_{pp}$ which is higher than the logic level $V_{dd}+V_{tn}$ is utilized. A level shifter 6 is formed of a pair of cross coupled P-channel transistors 7A and 7B. The sources of transistors 7A and 7B are connected to the voltage source $V_{pp}$. The level shifter defines a first and a second control node, respectively 8A and 8B.

The output of NAND gate 5 is connected through an inverter 9 to the gate of an N-channel FET 10. FET 10 has its source connected to ground and its drain connected to control node 8A.

The output of NAND gate 5 is connected to the gate of an N-channel FET 11, which has its source connected to ground and its drain connected to control node 8B. A third N-channel FET 12 has its source connected to ground, its drain connected to the drain of-transistor 11, and its gate to control node 8A.

Control node 8A (or a buffered version of control node 8A) is applied to the gate of pass transistor 14A and pull down transistor 13A. The source of pass transistor 14A is connected to $V_{pp}$ or to a secondary decoder output which provides a $V_{ss}$ or $V_{pp}$ level output; its drain to word line 1. The source of pull down transistor 13A is connected to ground; the drain is connected to word line 1.

In operation, assume that the word line 1 has not been selected. At least one address input of NAND gate 5 is low, causing the output of NAND gate 5 to be high, and the output of inverter 9 to be low. Transistor 11 is enabled, pulling node 8B to ground. Transistor 10 is disabled, allowing transistor 7A to charge node 8A to $V_{pp}$. Transistor 12 is thus enabled ensuring that node 8A is pulled high. The $V_{pp}$ level node 8A disables the pass device 14A and enables pull down transistor 13A so that word line 1 is held at ground. Thus transistors 3A and 3B are not enabled and are not conducting. The charge stored on capacitors 4A and 4B are thus maintained, and are not read to the bit lines.

Assume now that word line 1 is selected. Logic high level address signals at the voltage level $V_{dd}$ are applied to the inputs of NAND gate 5. The output of the NAND gate thus goes to low level. The output of inverter 9 changes to high level, transistor 10 is enabled, and pulls node 8A toward ground. This causes transistor 7B to be enabled, and pull node 8B toward $V_{pp}$. This causes transistor 7A to be disabled so that node 8A is pulled to ground, disabling transistor 12 and allowing transistor 7B to charge node 8B to $V_{pp}$. The ground level voltage on node 8A disables pull down transistor 13A, and enables the pass transistor 14A so that the word line 1 is driven to a $V_{pp}$ level. The voltage on the word line is thus controlled, and depending on whether the word line is selected or not, it switches between ground and $V_{pp}$. With the voltage $V_{pp}$ being controlled to $V_{dd}+V_{tn}$, the voltage at the gates of the cell access transistors 3A and 3B is certain to be $V_{dd}+V_{tn}$. However the voltage $V_{pp}$ is selected to be less than a voltage that would be in excess of that which would deteriorate reliability of the DRAM.

A person understanding this invention may now conceive of alternative structures and embodiments or variations of the above. All of those which fall within the scope of the claims appended hereto are considered to be part of the present invention.

What is claimed is:

1. An apparatus for selecting a word line and writing to memory cells in a dynamic random access memory (DRAM), the apparatus comprising:
   a level shifter circuit including at least first and second transistors having their respective sources directly connected to a controlled high supply voltage level Vpp supplied from a high voltage supply, the level shifter circuit being configured to:
   respond to a decoded address input signal selectively having logic voltage levels that are less than the controlled voltage level Vpp, the drain of the first transistor being configured to apply current to a first node, the drain of the second transistor being configured to apply current to a second node, the first and second transistors being gated from the second and first nodes, respectively, and
   produce a control signal selectively having the controlled high supply voltage level Vpp or a Vss voltage level; and
   a driving circuit to drive a selected word line to the controlled high supply voltage level Vpp in response to the control signal to write a logic voltage level in a DRAM cell storage capacitor associated with the selected word line.

2. The apparatus of claim 1 wherein the driver comprises:
   a third transistor for coupling the controlled high supply voltage level Vpp and the word line in response to the control signal to drive the selected word line.

3. The apparatus of claim 1 wherein the driver comprises:
   a third transistor for coupling a secondary decoder output, having an output voltage level at the controlled high supply voltage level Vpp, and the word line in response to the control signal to drive the selected word line.

4. The apparatus of claim 1 wherein the level shifter circuit further includes:
   a fourth transistor and a fifth transistor configured to respond to the decoded address input signal to gate the first and second transistors.

5. The apparatus of claim 4 wherein:
   the first and second transistors are P-channel FETs; and
   the fourth and fifth transistors are N-channel FETs, the drains of the first and second transistors being pulled down by the fourth and fifth transistors, respectively, in response to the decoded address input signal.

6. The apparatus of claim 1 wherein:
   the gate of the first transistor is directly connected to the drain of the second transistor; and
   the gate of the second transistor is directly connected to the drain of the first transistor.

7. A dynamic random access memory (DRAM) for storing a voltage level in a memory cell coupled to a word line and a bit line, the DRAM comprising:
   a level shifter circuit including at least first and second transistors having their respective sources directly connected to a controlled high supply voltage level Vpp supplied from a high voltage supply, the level shifter circuit being configured to:
   respond to a decoded address input signal selectively having logic voltage levels that are less than the controlled voltage level Vpp, the drain of the first transistor being configured to apply current to a first node, the drain of the second transistor being configured to apply current to a second node, the first and second transistors being gated from the second and first nodes, respectively, and produce a control signal selectively having the controlled high supply voltage level Vpp or a low voltage level; and a driving circuit to drive a selected word line to the controlled high supply voltage level Vpp in response to the control signal to write a logic voltage level in a DRAM cell storage capacitor associated with the selected word line.

8. The DRAM of claim 7 wherein the driver comprises:
a third transistor for coupling the controlled high supply voltage level Vpp and the word line in response to the control signal to drive the selected word line.

9. The DRAM of claim 7 wherein the driver comprises:
a third transistor for coupling a secondary decoder output, having an output voltage level at the controlled high supply voltage level Vpp, and the word line in response to the control signal to drive the selected word line.

10. The DRAM of claim 7 wherein the level shifter circuit further includes:
a fourth transistor and a fifth transistor configured to respond to the decoded address input signal to gate the first and second transistors.

11. The DRAM of claim 10 wherein:
the first and second transistors are P-channel FETs; and
the fourth and fifth transistors are N-channel FETs, the drains of the first and second transistors being pulled down by the fourth and fifth transistors, respectively, in response to the decoded address input signal.

12. The DRAM of claim 7 wherein:
the gate of the first transistor is directly connected to the drain of the second transistor; and
the gate of the second transistor is directly connected to the drain of the first transistor.

13. A dynamic random access memory (DRAM) comprising a word line driver configured to:
receive a word line select address signal having a selected one of a low logic level voltage Vss and a high logic level voltage Vdd, and
selectively apply a controlled high supply voltage Vpp to the word line through the source-drain circuit of a P-channel pass FET, the controlled high supply voltage Vpp being substantially equal to or greater than the high logic level voltage Vdd plus one FET threshold voltage (Vdd+Vtn), the controlled high supply voltage Vpp being directly connected to the sources of first and second pull-up FETs,
the gate of the second pull-up FET and the drain of the first pull-up FET being coupled to a first node,
the gate of the first pull-up FET and the drain of the second pull-up FET being coupled to a second node,
the drain of a first pull-down FET being coupled to the first node, the drain of a second pull-down FET being coupled to the second node,
the first and second pull-up FETs being gated from the second and first nodes, respectively, in response to the word line select address signal to provide a control signal selectively having the high supply voltage Vpp or a Vss voltage level to the gate of the P-channel pass FET.

14. The DRAM of claim 13 wherein the word line driver includes:
a third pull-down FET for selectively pulling down the second node in response to the control signal.

15. The DRAM of claim 14 wherein the word line driver further includes:
a logic gate for responding solely to the logic states of the word line select address signals to produce a node driving signal.

16. The DRAM of claim 15 wherein the node driving signal comprises:
first and second driving signals that are provided to the gates of the first and second pull-down FETs, respectively.

17. The DRAM of claim 16 wherein the word line driver further includes:
an inverter for inverting the second driving signal to produce the first driving signal.

18. The DRAM of claim 13 wherein the word line driver includes:
a third pull-down FET for selectively pulling down the word line in response to the control signal being provided to the gate thereof.

19. The DRAM of claim 13, wherein a decoded secondary decoder output provides the controlled high supply voltage Vpp to the source-drain circuit of the P-channel pass FET.

20. The DRAM of claim 13, wherein the controlled high supply voltage Vpp is directly connected to the source-drain circuit of the P-channel pass FET.

21. The DRAM of claim 13 wherein:
the gate of the first transistor is directly connected to the drain of the second transistor; and
the gate of the second transistor is directly connected to the drain of the first transistor.

* * * * *